United States Patent
Simpson

[11] Patent Number: 5,828,142
[45] Date of Patent: Oct. 27, 1998

[54] PLATEN FOR USE WITH LITHOGRAPHIC STAGES AND METHOD OF MAKING SAME

[75] Inventor: Craig R. Simpson, Danville, Vt.

[73] Assignee: MRS Technology, Inc., Chelmsford, Mass.

[21] Appl. No.: 918,704

[22] Filed: Aug. 22, 1997

Related U.S. Application Data

[63] Continuation of Ser. No. 560,393, Nov. 17, 1995, abandoned, which is a continuation-in-part of Ser. No. 316,739, Oct. 3, 1994, abandoned.

[51] Int. Cl.$^6$ .......................... H02K 41/02; H02K 15/02
[52] U.S. Cl. .................................. 310/12; 29/596
[58] Field of Search ................... 310/12, 13, 43, 310/44, 45, 216; 29/596; 264/611; 75/252, 330, 363

[56] References Cited

U.S. PATENT DOCUMENTS

| | | | |
|---|---|---|---|
| Re. 27,436 | 7/1972 | Sawyer | 310/12 |
| 3,478,877 | 11/1969 | Parry | 209/80.5 |
| 3,610,413 | 10/1971 | Bandenburg | 209/80.5 |
| 3,656,014 | 4/1972 | Rich | 310/13 |
| 3,695,760 | 10/1972 | Orr | 355/95 |
| 3,889,165 | 6/1975 | Nguyen Van | 310/12 |
| 4,015,154 | 3/1977 | Tanaka et al. | 310/43 |
| 4,158,580 | 6/1979 | Reynolds et al. | 148/105 |
| 4,218,507 | 8/1980 | Deffeyes et al. | 428/328 |
| 4,360,377 | 11/1982 | Steck et al. | 148/105 |
| 4,543,526 | 9/1985 | Burckhardt et al. | 324/61 R |
| 4,560,911 | 12/1985 | Chitayat | 318/135 |
| 4,601,753 | 7/1986 | Soileau et al. | 428/407 |
| 4,607,213 | 8/1986 | Neukermans et al. | 324/61 R |
| 4,698,575 | 10/1987 | Bouwer | 318/640 |
| 4,733,143 | 3/1988 | Chitayat | 318/135 |
| 4,841,225 | 6/1989 | Meyer | 324/61 R |
| 4,893,071 | 1/1990 | Miller | 324/660 |
| 4,911,075 | 3/1990 | Lewis et al. | 101/453 |
| 4,939,456 | 7/1990 | Morelli et al. | 324/207.21 |
| 4,958,115 | 9/1990 | Miller | 318/662 |
| 5,015,622 | 5/1991 | Ward et al. | 505/1 |
| 5,039,559 | 8/1991 | Sang et al. | 428/402.24 |
| 5,063,011 | 11/1991 | Rutz et al. | 64/126 |
| 5,068,653 | 11/1991 | Klingler et al. | 340/870.37 |
| 5,126,648 | 6/1992 | Jacobs | 318/640 |
| 5,268,140 | 12/1993 | Rutz et al. | 419/54 |
| 5,304,937 | 4/1994 | Meyer | 324/686 |
| 5,309,056 | 5/1994 | Culp | 310/306 |
| 5,362,560 | 11/1994 | Ehrhart et al. | 428/343 |
| 5,434,504 | 7/1995 | Hollis et al. | 324/207.17 |
| 5,472,661 | 12/1995 | Gay | 428/551 |
| 5,563,001 | 10/1996 | Gay | 428/403 |

FOREIGN PATENT DOCUMENTS 62-144557   6/1987   Japan ........................... H02K 37/14

*Primary Examiner*—Clayton E. Laballe
*Attorney, Agent, or Firm*—Hamilton, Brook, Smith & Reynolds, P.C.

[57] ABSTRACT

A lithographic stage is carried by a platen formed of a plurality of tiles containing a uniformly spaced grid of teeth and having low reluctance and high resistivity. The teeth have been formed by powder metal technology using as powder particles of a ferromagnetic material, the particles being of high resistivity or coated with an insulating material. The space between the teeth is filled with non-magnetic material, such as epoxy, and the entire platen finished such that it has a smooth and uniform flat upper surface.

25 Claims, 6 Drawing Sheets

1

PLATEN FOR USE WITH LITHOGRAPHIC STAGES AND METHOD OF MAKING SAME

This application is a continuation of application Ser. No. 08/560,393 filed Nov. 17, 1995 now abandoned, which is a Continuation-in-Part of U.S. Ser. No. 08/316,739, filed Oct. 3, 1994 now abandoned.

GOVERNMENT FUNDING

This invention was made with Government support under Contract No. F33615-92-C-5805 awarded by the United States Air Force. The Government has certain rights in the invention.

FIELD OF THE INVENTION

This invention relates to a platen usable with a lithographic stage, a platen which will permit rapid and accurate positioning of the stage, i.e., a platen usable, for example, with Sawyer type motors (linear stepping motors).

BACKGROUND OF THE INVENTION

The manufacture of electronic devices, such as large area electronic devices (LAED's), by lithographic technology involves the multiple projection of reticle images upon photoresist coated substrates. This, in turn, requires the projection of "stitched" multiple images upon each of the layers, so that the entire substrate area can be covered. A positioning accuracy of at least 0.2 $\mu$m is necessary. Thus, it is highly important that the stage carrying the substrate be capable of precise movement; and, for efficiency, it is also important that this movement be rapidly accomplished.

In the past, linear motors have been used to position the stage, and external sensors, such as interferometers, have been used to determine the positions. Examples of such prior usages would include U.S. Pat. Nos. to Chitayat 4,560,911; Resor et al. 4,769,680 (now Re. 33,836); Miller 4,893,071; and Miller 4,958,115.

The present invention uses linear stepping motors and a unique platen; and it achieves precise positioning by use of sensing means related to the platen. In the prior art, linear stepping motors have used soft iron in the platen with a tooth pitch of about 1. mm.. The platen is chemically etched to produce the approximately 0.5 mm square teeth. The use of soft iron with its low resistivity, however, causes large eddy current losses. Fabrication of coarse pitch units has been a problem because soft iron is difficult and expensive to machine, and the teeth cannot be chemically etched to the required tolerance. Also the eddy current losses would still exist. The present invention solves these problems by using powdered metal technology, whereby small tiles are pressed and then formed into a large platen of any practical size. An insulated powder is used so the eddy currents are reduced significantly.

BRIEF SUMMARY OF THE INVENTION

This invention relates to the field of lithography, and has the usual optical systems for projecting reticle images upon a substrate. It includes a stage, with a supporting platen, and uses linear motors associated with the stage to adjust the position of the stage in both x-, y-, and Θ-directions. The platen consists of an array of grid tiles each having a multiplicity of precisely placed magnetic teeth running in orthogonal directions. The tiles have been formed through powder metallurgy techniques, using a coated powdered metal so as to increase resistance and decrease eddy currents. The space between the teeth has been filled with a non-magnetic and relatively non-conducting material such as filled epoxy resin where the filler is Aluminum oxide ($Al_2O_3$) for instance; and the upper surface of the platen has been ground or lapped flat so that it is planar and smooth. Thus, the linear motors, acting in conjunction with the teeth can move the stage the desired amounts in the desired directions over the surface of the platen.

DETAILED DESCRIPTION OF THE INVENTION

Figure 1:
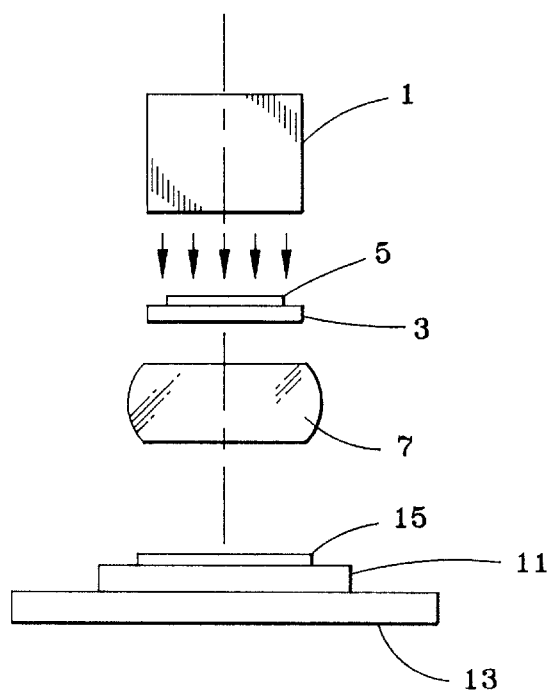
FIG. 1 is a generalized elevation showing the layout of a lithographic projection system.

FIG. 1 shows the type of lithographic projection system which could be used with the present invention. It includes a light source 1, projecting light through reticle holder 3, with reticle 5, through projection lens 7. The resulting image is formed on the upper surface of substrate 15 on movable stage 11, carried by platen 13.

Figure 2:
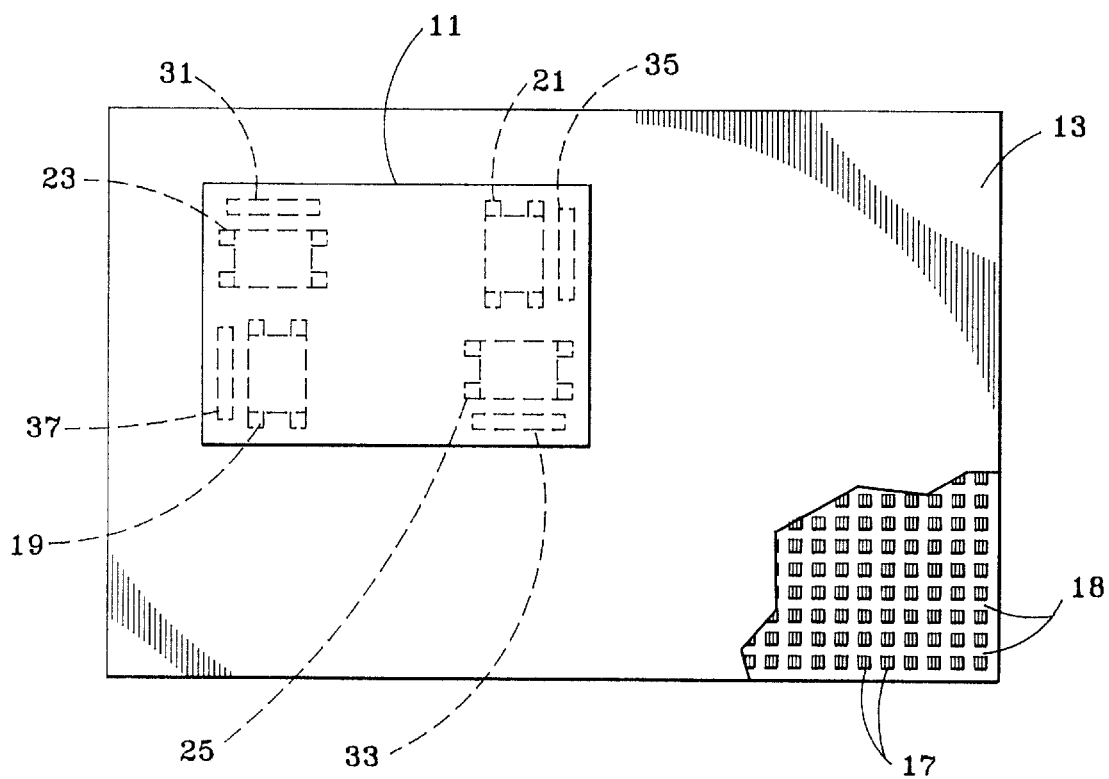
FIG. 2 is a plan view of the stage and platen of the type used in my invention.

The movable stage 11 and its supporting platen 13 are shown in more detail in FIG. 2. Platen 13 has an upper surface 16 formed of a series of aligned and equally spaced ferromagnetic teeth 17 with non-magnetic material, such as epoxy filler 18, in between, ground to provide a smooth, planar upper surface 16 (See also FIGS. 3 and 8 to 10). The teeth are arranged in rows, running in the x-direction (horizontal in FIG. 2) and columns running in the y-direction (vertical in FIG. 2). The teeth are square, of uniform width and length, and are spaced from one another an equal distance. They are preferably 2.5 mm on a side, spaced 2.5 mm from one another, and 1 mm high. The platen is formed from an array of small tiles typically 50 mm on a side, each containing 100 2.5 mm×2.5 mm teeth arranged on 5 mm centers.

The tiles are preferably formed by powder metallurgy (under heat and pressure) from soft iron particles measuring about 80 to 160 microns across (80 to 40 mesh). The powder is currently pure iron, similar to CARPENTER ELECTRICAL IRON, but the iron may also contain small amounts of Silicon (1 to 3 wt %) to reduce hysteresis loss. The iron powder used would be coated with an insulating material, such as LEXAN or polycarbonate, but may also be insulated with a glass or ceramic material. The tiles are formed at about 550° F. at a pressure of between 45 and 55 tons per square inch. The tiles may be subsequently heat treated to improve the mechanical and magnetic properties.

The size of the teeth and their spacing should be the same, though, if desired, sizing and spacing can be different in the x-direction from that in the y-direction. The space between the teeth is filled with filled epoxy resin, and the resulting upper surface is ground and/or lapped to produce a planar upper surface flat to at least within about 2 $\mu$m per 200 mm by 200 mm square surface area. The teeth are shown, prior to the addition of the epoxy resin, in FIG. 8; and, after the addition of the resin, in FIG. 9.

Figure 10:
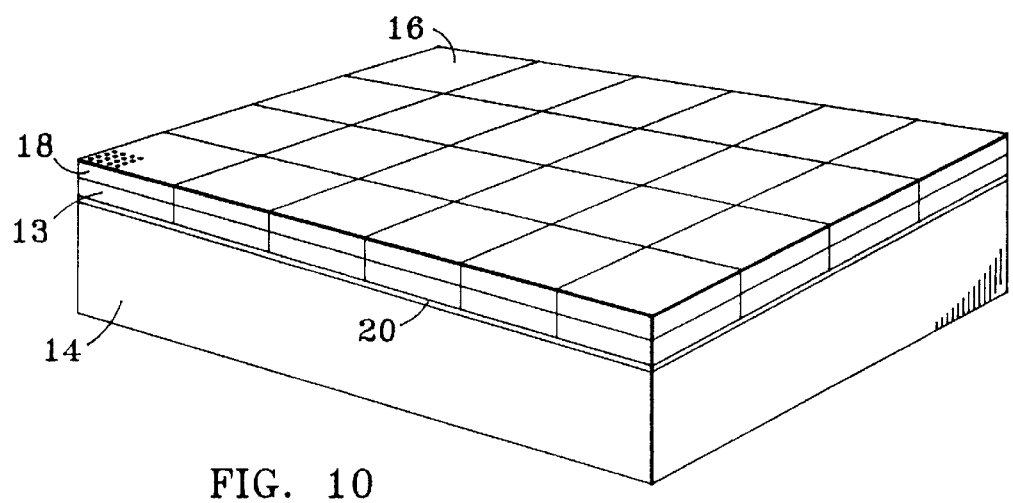
FIG. 10 is a perspective view of a section of platen, formed of many separate grid tiles, all mounted on the same base.

The platen is formed from an array of tiles. Thus, as shown in FIG. 10 twenty four tiles 13 can be secured to a granite base 14 by adhesive 20, creating a 300 mm×200 mm platen. The twenty four tiles should be aligned such that their teeth form one continuous flat surface; and the tiles positioned relative to one another such that the spacing of the teeth between tiles is the same as the spacing of the teeth on a single tile.

Stage 11 is supported above platen 13 on air bearings of the customary type. The air gap 43 (FIG. 3) between the sensor plates 45A–D and the teeth 17 of the platen can be any reasonable distance required, but I have found a distance of about 13 $\mu$m satisfactory.

The movable stage 11 carries four linear motors, two for movement of the stage in the x-direction, motors 19 and 21; and two for movement of the stage in the y-direction, motors 23 and 25. Pairs of x-motors, or y-motors, or both are used to control motion in the theta direction, i.e., rotation. Motors 19 and 21 are at a 90 degree angle to motors 23 and 25. Motors 19 and 21 work in conjunction with rows of teeth running in the y-direction; and motors 23 and 25 work in conjunction with rows of teeth running in the x-direction.

As can be seen from FIG. 2, the platen 13 can be considerably larger than the stage 11, permitting a large, but precise, range of movement of the stage over the platen.

Position sensors 31 and 33 are positioned within the y-direction linear motors 23 and 25; and position sensors 35 and 37 are positioned within the x-direction linear motors 19 and 21. The sensors serve to determine the exact position in the x- and y-direction (and degree of rotation) of the stage with respect to the platen 13. This information is then used in association with a computer to drive the linear motors, causing the movable stage to be located in exactly the position desired.

Figure 3:
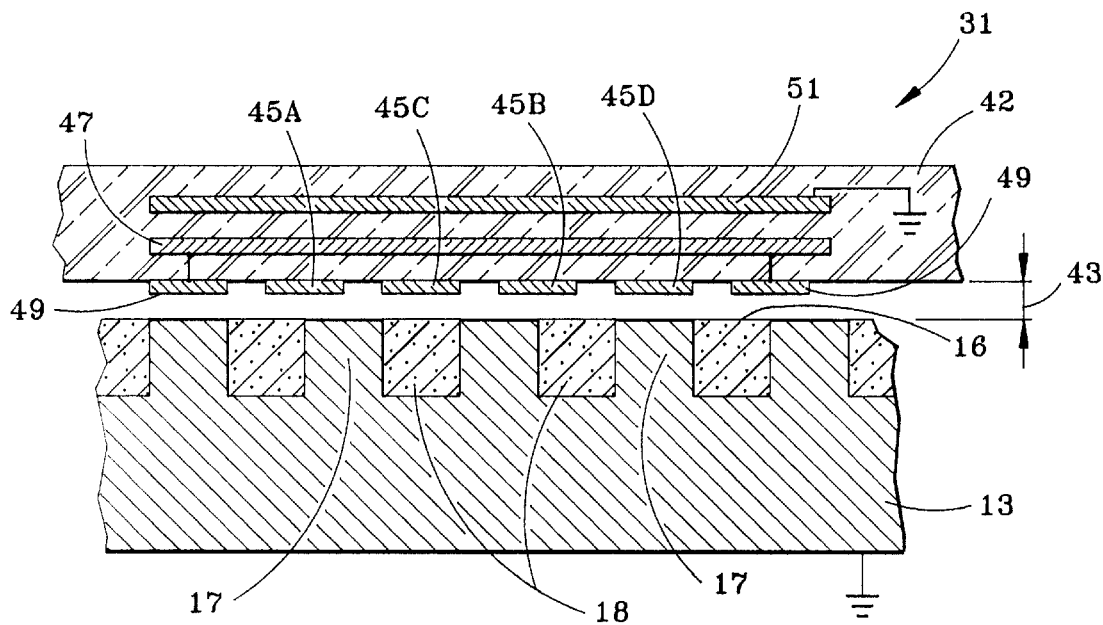
FIG. 3 is a vertical section through a portion of the platen and a portion of the stage, showing the positioning of the sensors with respect to the teeth.

FIG. 3 is a vertical section showing the relationship of one sensor 31 with respect to the teeth 17 on the platen; the other sensors 33, 35, and 37 are similar. Each sensor carries four sensor plates 45A, 45B, 45C, and 45D on a PC board 42. Each sensor plate should have the same width dimensions as the teeth, which, in the given example, is 2.5 mm. The length should be an integral multiple of the pitch length which in this case is 80 mm. For reasons to be described below, the sensor plates are paired, and alternate in position. Thus, plates 45A and 45B are one pair; and plates 45C and 45D are another pair, with plate 45C between plates 45A and 45B, and plate 45B between plates 45C and 45D. To avoid stray capacitance a metal shield layer 47 is positioned above the sensors on the PC board, and, in addition, shield plate 49 surrounds the row of plates 45A–D and is connected to shield layer 47. The shield layer 47 and shield plates 49 are driven by the same voltage as are the sensor plates 45A–D. As a result, there is no voltage between the sensor plates and the shields 47 and 49 and therefore no current flows due to the capacitance between the sensor plates and the shield. The shield plates also serve to focus the field from the sensor plates to the teeth on the platen. For additional protection, a grounded ground plate 51 is carried by the PC board above shield layer 47.

Figure 4:
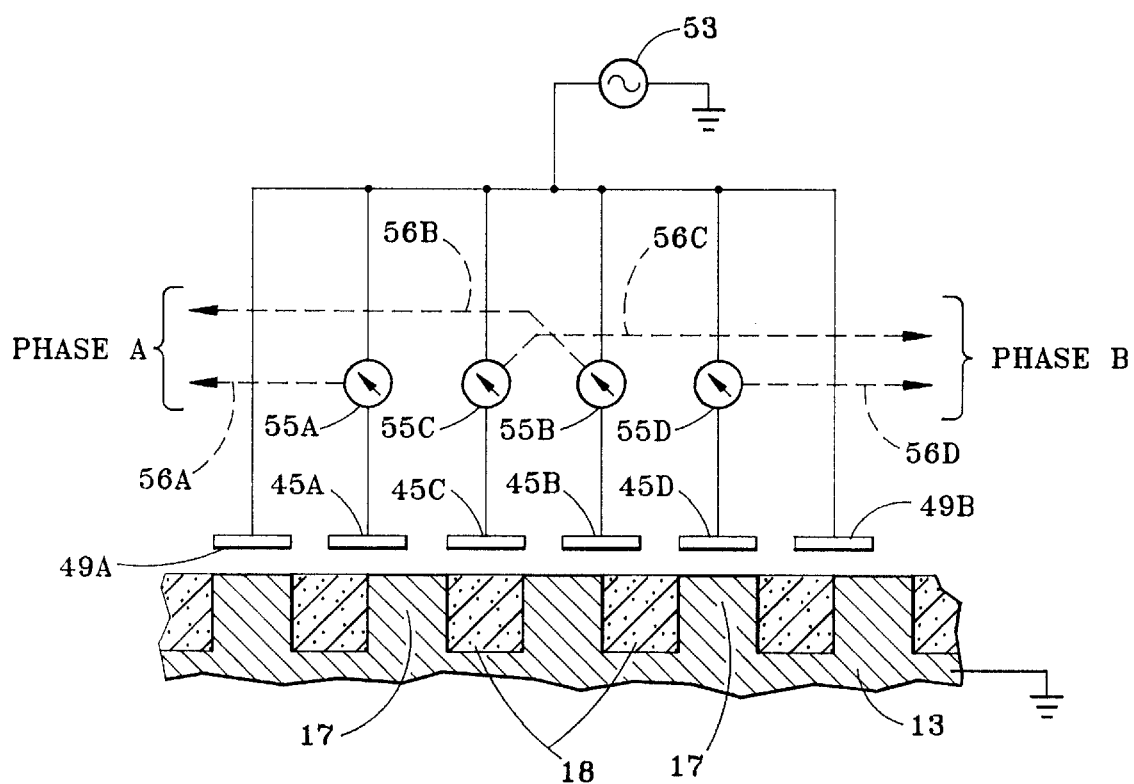
FIG. 4 is a simplified circuit diagram showing the system of current measurement used to determine the capacitances of the various sensor plates from position to position.

Measurement of the capacitances between each of sensor plates 45A–D and the teeth is required. This measurement is based upon the principle that, for a given frequency, the current flow through a capacitor is proportional to the capacitance. A schematic drawing of the wiring necessary to measure these capacitances is shown in FIG. 4. Metal platen 13 is grounded, so its teeth 17 form the second plate of capacitors with each of the plates 45A–D. Their capacitance will vary with the position of each of the plates relative to the teeth. Sensor plates 45A, 45B, 45C, and 45D each in series with their respective ammeters 55A, 55B, 55C, and 55D, and these are connected to a sine wave power source 53, preferably having a frequency in the range between 1 to 5 megaHz. Outputs from the ammeters are on lines 56A, 56B, 56C, and 56D, respectively. Thus, the output from the first pair of sensor plates 45A and 45B are on lines 56A and 56B; and the outputs from the second pair of sensor plates 45C and 45D are on lines 56C and 56D. I refer to the output from the first pair as "Phase A," and from the second as "Phase B." These outputs will vary depending upon the position of the respective sensor plates relative to the teeth; and, therefore, this output, when properly interpreted, serves to identify the specific position of the stage relative to the platen.

Figure 5:
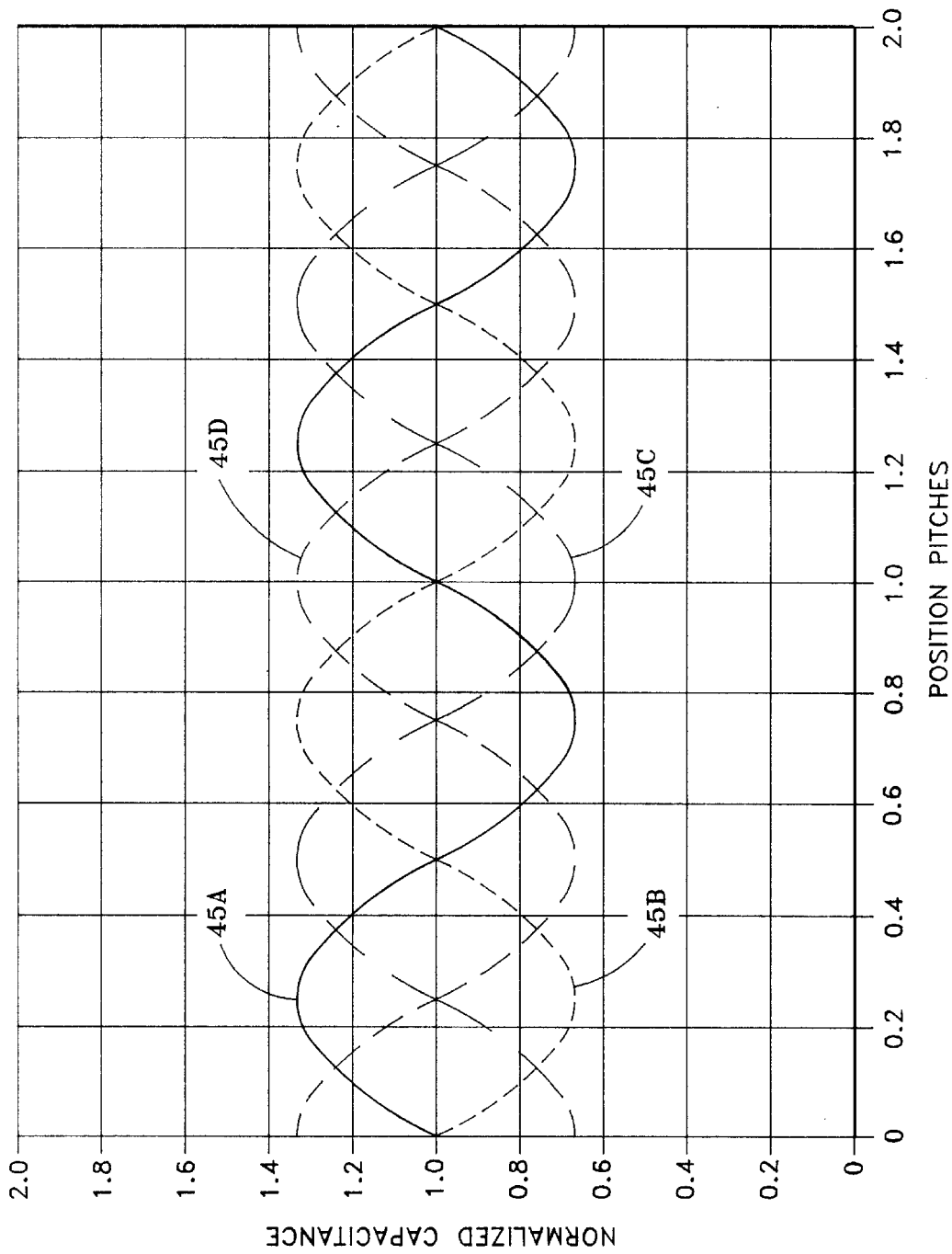
FIG. 5 is an idealized graph showing the relative capacitances of each of the four sensor plates for different positions relative to the teeth in the platen. By knowing the ratios and magnitudes of these capacitances, the position within any pitch can be determined.

FIG. 5 is a graph showing how the relative capacitances measured for each of the sensor plates would vary ideally with position. The abscissa indicates the position of the plates relative to the teeth on the platen; and the ordinate shows the relative measured capacitance. As can be seen, when the plate is directly over a tooth (such as position 1 in the abscissa for sensor plate 45D; see FIG. 4), its relative capacitance is at a maximum (about 1.35); and when it is directly over the epoxy space or void between teeth (again, using position 1), such as sensor plate 45C, its relative capacity is at a minimum (about 0.625). When a sensor plate is halfway between a tooth and a void, its relative capacitance is 1. Thus, sensor plate 45A will be directly over a tooth at position pitches of about 0.25 and 1.25; sensor plate 45B will be directly over a tooth at position pitches of about 0.75 and 1.75; and similarly for the other sensor plates.

Accordingly, measured capacitance is indicative of sensor position, which means that the position of the platen in the x-, y-, and Θ-directions can be determined by determining relative capacitances.

It is important, however, to be sure that the measurements of capacity are precise, and that localized conditions are prevented from causing error. Thus, the measured currents of each pair of sensor plates are subtracted from one another to remove any component of current that is independent of motor position, i.e., the DC bias, and to enhance the component of current that is dependent upon motor position. (By first pair and second pair I refer to sensor plates 45A and 45B, and sensor plates 45C and 45D, respectively). Therefore, for what I call "Phase A," the readings from ammeters 55A and 55B, on lines 56A and 56B, are subtracted from each other to give a net reading; and, for what I call "Phase B," the readings from ammeters 55C and 55D, on lines 56C and 56D, are subtracted from each other to give a net reading. These outputs for Phase A and Phase B are 90 degrees out of phase.

In addition, I determine the ratio of Phase A to Phase B (A/B) and the ratio of Phase B to Phase A (B/A) to normalize them. This removes dependence on gap height 43, amplitude of the signal from source 53, the frequency of source 53, and ADC gain. There are four possible combinations of phase size and phase ratios. These are:

For Phase A/B: A>B and A<B; and
For Phase B/A: A>B and A<B.

Figure 6:
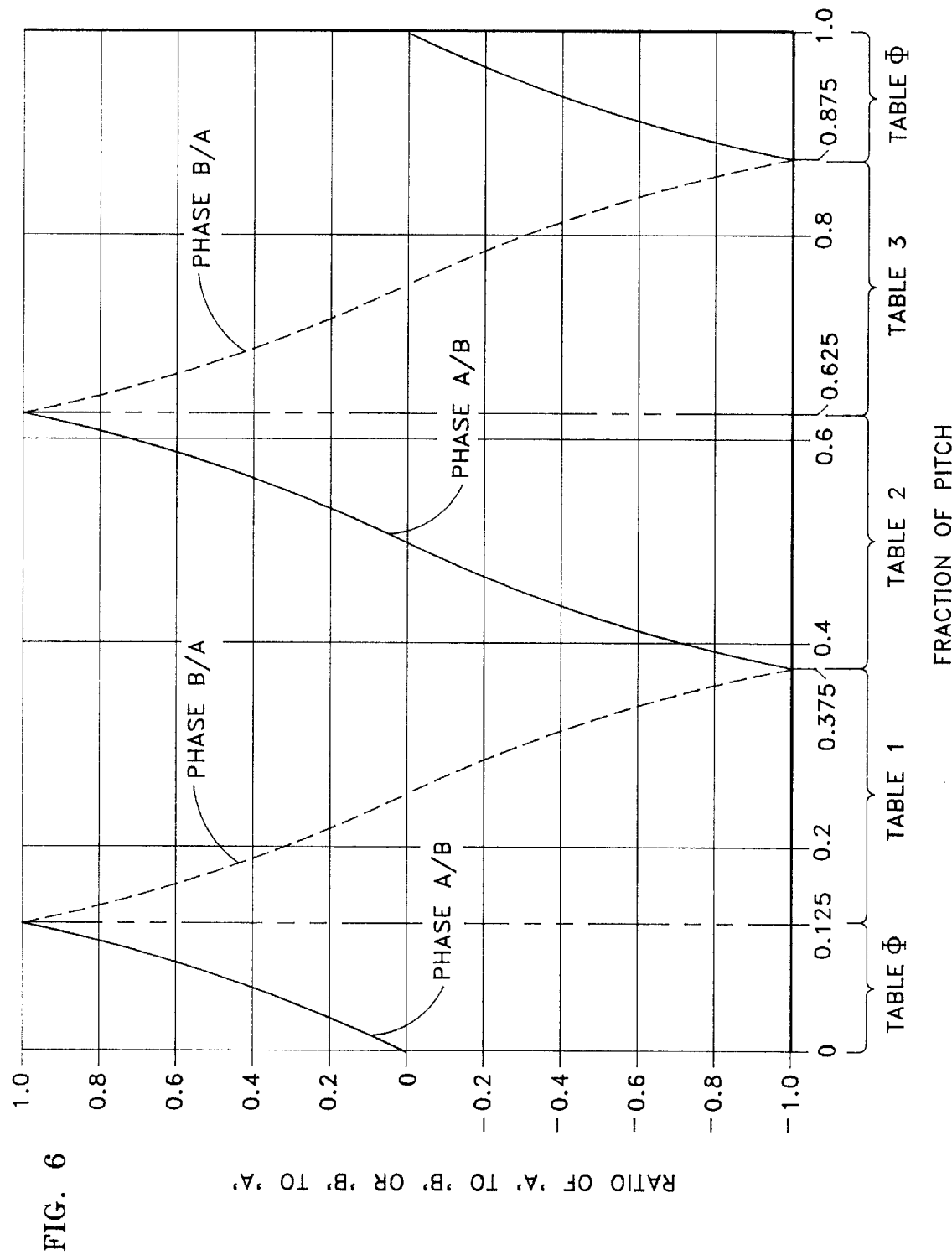
FIG. 6 is a graph showing the calculated ratios of the capacitances, for determining which correction table is to be used.

By knowing the ratios and relative magnitudes of Phases A and B, the position within any pitch can be determined. These are plotted graphically in FIG. 6. Since we are dealing with the need for extreme accuracy of position (such as ±0.2 $\mu$m), it is likely that each pitch may have a slight variation from the nominal pitch. As a result, tables of actual pitch length vs. pitch number must be prepared and used to determine the actual position. These tables are used to supply corrections. Actual positions are accessed and referenced by using the Phase ratios and the Phase differences. Thus, as set forth in FIG. 6:

Table 0 is used for Phase A/B and A<B
Table 1 is used for Phase B/A and A>B
Table 2 is used for Phase A/B and A<B
Table 3 is used for Phase B/A and A>B Accordingly, by knowing the ratios and the magnitudes of the A and B Phases, the position within any pitch can be determined. This is shown in FIG. 6, where curves of the Phase ratios are plotted against A<B and A>B; and the selection of tables and the points used in the tables are determined from the curves shown. The position determined then equals the fraction of the current pitch times the current pitch length plus the sum of all previous pitch lengths.

This procedure is used separately for each of the position sensors used, and the result of all these calculations provides a computer with the stage's position in x, y and Θ (theta). The computer can then provide the necessary signals to the linear motors to position the stage as desired.

Figure 7:
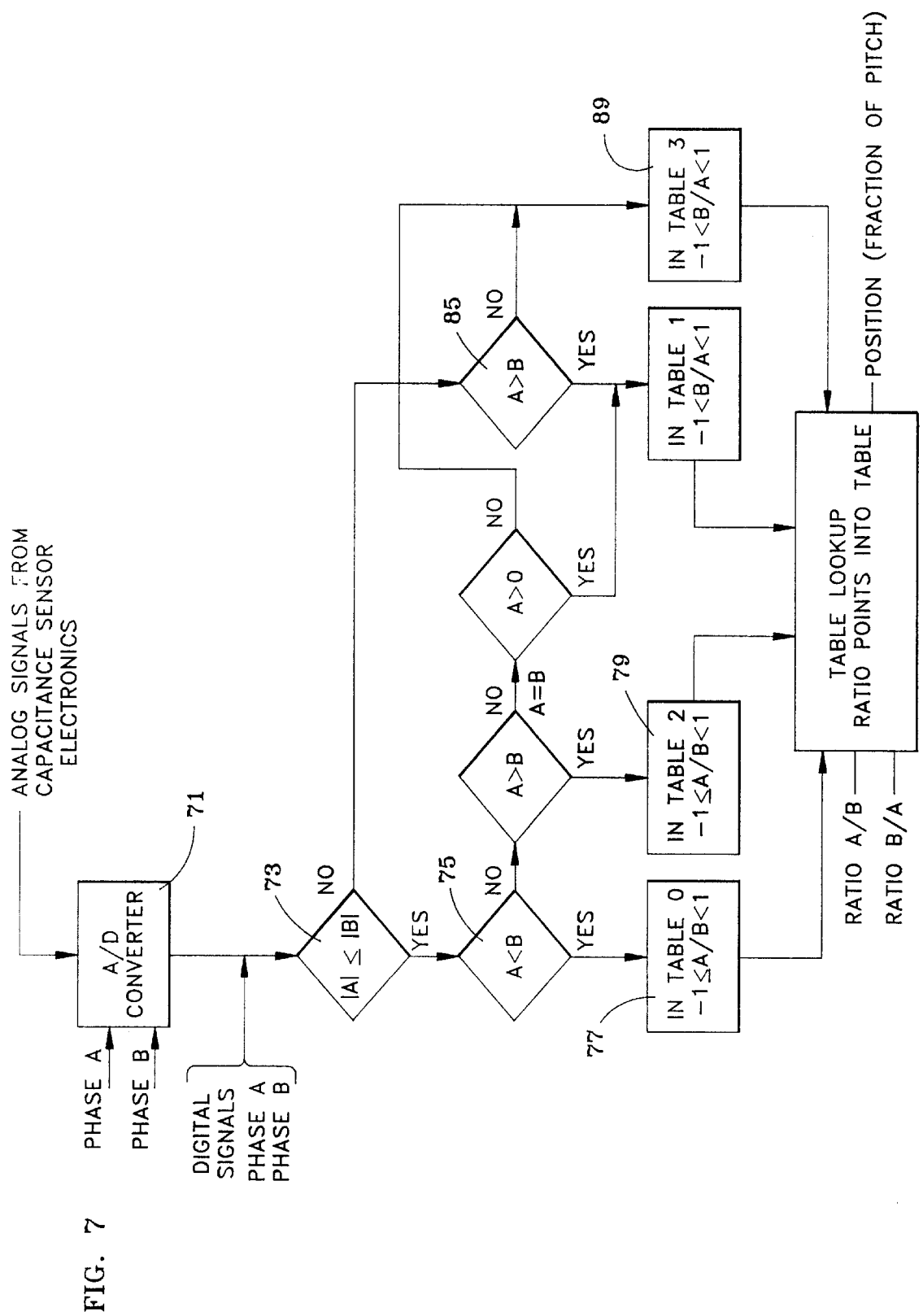
FIG. 7 is a flow chart used to determine position and pitch error, so that the platen position can be adjusted for most accurate placement.
Figure 8:
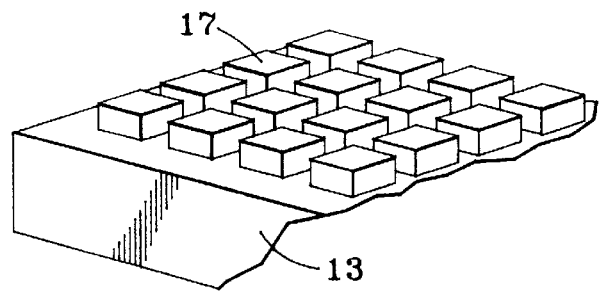
FIG. 8 is a perspective view of the tile, showing its teeth, but before application of filler epoxy.
Figure 9:
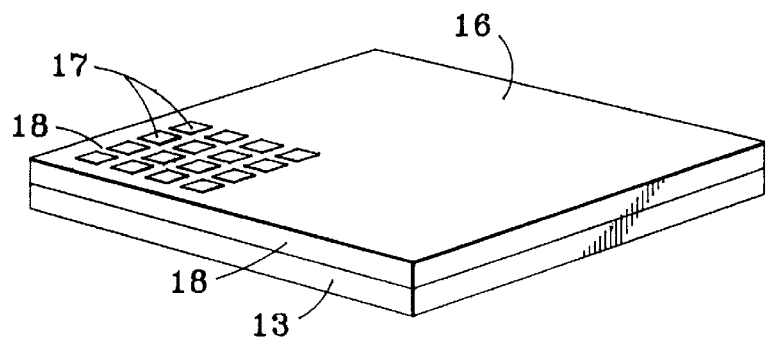
FIG. 9 is a perspective view of the platen, after filler epoxy has been applied.

FIG. 7 is a flow chart showing the computer steps used in these calculations. The analog signals of Phase A and Phase B (from FIG. 4) are fed to an analog to digital converter 71 where they are converted to digital signals with enough accuracy for the required positional resolution. These digital signals are processed in the computer according to block diagram FIG. 7. Signals are then sent to the linear motors 19, 21, 23, and 25, as required, for correct positioning of the stage.

It has been found that this system of stage positioning provides the necessary accuracy and speed for efficient lithographic processing.

I claim:

1. A platen including:
   a base;
   tiles integral with said base and extending upwardly therefrom, said tiles being formed of powdered magnetic material, said powdered magnetic material being coated, each said tile being of uniform size and having a uniform array of teeth and having interstices between said teeth;
   non-magnetic material filling said interstices; and
   said teeth and said non-magnetic material defining a smooth, planar upper surface for said platen.

2. A platen as set forth in claim 1 in which said powdered magnetic material is iron.

3. A platen as set forth in claim 1 in which said powdered magnetic material is iron including about 1% to 3% silicon by weight.

4. A platen as set forth in claim 1 in which said powdered magnetic material is ferrite.

5. A platen as set further in claim 1 in which said powdered magnetic material is iron coated with polycarbonate.

6. A platen as set forth in claim 1 in which said powdered magnetic material is iron coated with glass.

7. A platen as set forth in claim 1 in which said powdered magnetic material is about 40 to 80 mesh.

8. A platen as set forth in claim 1 in which said non-magnetic material is filled epoxy resin.

9. A platen as set forth in claim 8 in which said epoxy resin is filled with $Al_2O_3$.

10. A platen as set forth in claim 1 in which said smooth, planar upper surface has a flatness of at least 2 $\mu$m per 200 mm by 200 mm square.

11. A platen as set forth in claim 1 being made of a plurality of said tiles, each said tile having said non-magnetic material between said teeth, and forming said planar upper surface, said tiles being secured to said base such that their respective said upper surfaces lie in a common plane.

12. A combined platen and stage for use in photolithography,
   said stage including a platform for carrying a substrate and having at least two linear motors thereon, said linear motors being orthogonal to each other,
   said platen including a base and tiles integral with said base and extending upwardly therefrom, said tiles being formed of coated powdered magnetic material, being of uniform size and having a uniform array of teeth, interstices between said teeth being uniformly spaced,
   non-magnetic material filling said interstices,
   said teeth and said non-magnetic material defining a smooth, planar upper surface for said platen, and
   said stage being carried by said platen.

13. A combined platen and stage as set forth in claim 12 in which said smooth upper surface has a flatness of at least 2 $\mu$m per 200 mm by 200 mm square.

14. A combined platen and stage as set forth in claim 12 in which said coated powdered magnetic material is iron including about 1% to 3% silicon by weight coated with polycarbonate.

15. The method of making a platen including the steps of:
   using coated powdered iron material of 40 or 80 mesh,
   forming said coated powdered iron material into the form of a tile having teeth thereon at a temperature of about 550° F. at a pressure between 45 and 55 tons per square inch,
   arranging said tiles in an array to form said plate,
   thereafter inserting filled epoxy resin into spaces between said teeth, and
   machining said teeth and said epoxy resin to form a planar surface having a flatness of at least 2 $\mu$m per 200 mm by 200 mm square.

16. A method of making a platen that supports a stage propelled by linear motors, the method comprising:
   forming powdered ferromagnetic material into tiles;

forming teeth in rows and columns on a face of each tile;

exposing the tiles to heat and pressure;

securing the tiles to a base to form a continuous, flat surface; and filling interstices between the teeth with a filling material.

17. A method as described in claim 16, further comprising coating the powdered ferromagnetic material with an insulating material prior to formation into the tiles.

18. A method as described in claim 16, further comprising using powdered ferromagnetic material that has particle sizes between 80 and 160 microns, approximately.

19. A method as described in claim 16, wherein the powdered ferromagnetic material is iron.

20. A method as described in claim 16, wherein the step of exposing the tiles to heat and pressure comprises exposing the tiles to temperatures of about 550° F. and pressures between about 45 and 55 tons per square inch.

21. A method as described in claim 16, wherein the step of forming the teeth comprises forming teeth a few millimeters in size.

22. A method as described in claim 16, further comprising heat treating the tiles after exposure to the heat and pressure.

23. A method as described in claim 16, further comprising machining the tiles to form a flatter surface after the step of securing the tiles.

24. A method as described in claim 16, wherein the machining step comprises lapping the tiles to a more uniform flatness.

25. A method as described in claim 16, further comprising machining the surface of the tiles to a flatness of at least 2 $\mu$m per 200 mm by 200 mm square.

* * * * *